United States Patent [19]
Payne et al.

[11] Patent Number: 5,473,500
[45] Date of Patent: Dec. 5, 1995

[54] ELECTROSTATIC DISCHARGE CIRCUIT FOR HIGH SPEED, HIGH VOLTAGE CIRCUITRY

[75] Inventors: James E. Payne, Boulder Creek; Saroj Pathak, Los Altos Hills; Glen A. Rosendale, Santa Clara, all of Calif.

[73] Assignee: Atmel Corporation, San Jose, Calif.

[21] Appl. No.: 180,673

[22] Filed: Jan. 13, 1994

[51] Int. Cl.⁶ .................................................. H02H 3/22
[52] U.S. Cl. .................................... 361/111; 361/91
[58] Field of Search .................... 361/18, 56, 58, 361/91, 111, 118, 110; 307/550; 257/355, 358

[56] References Cited

U.S. PATENT DOCUMENTS

| | | | |
|---|---|---|---|
| 3,909,674 | 9/1975 | Spence et al. | 361/56 |
| 4,819,047 | 4/1989 | Gilfeather et al. | 361/58 |
| 4,868,705 | 9/1989 | Shiochi et al. | 361/91 |
| 4,930,036 | 5/1990 | Sitch | 361/56 |
| 4,937,700 | 6/1990 | Iwahashi | 361/91 |
| 4,980,742 | 12/1990 | Kertis et al. | 361/91 |
| 4,996,626 | 2/1991 | Say | 361/91 |
| 5,028,819 | 7/1991 | Wei et al. | 307/451 |
| 5,086,365 | 2/1992 | Lien | 361/58 |
| 5,243,490 | 9/1993 | Ontko et al. | 361/91 |

*Primary Examiner*—A. D. Pellinen
*Assistant Examiner*—Ronald W. Leja
*Attorney, Agent, or Firm*—Schneck & McHugh

[57] ABSTRACT

A protection circuit includes a first controlled path for discharging negative ESD pulses introduced at a signal node. The first controlled path is from the signal node to $V_{cc}$ via the source and drain electrodes of a first transistor. The gate of the transistor is at a soft ground by connection of the gate through a resistor and an inverter to a fixed voltage supply potential ($V_{cc}$). A second controlled path discharges positive ESD pulses via source and drain regions of serially connected second and third transistors to ground. The second transistor has a gate tied at $V_{cc}$ by means of a resistor and inverter to ground. The third transistor is at soft ground by means of a resistor and inverter to $V_{cc}$. The third transistor is turned on by a positive voltage exceeding the threshold voltage of the third transistor, but the second transistor prevents damage to the third transistor by limiting the voltage applied to the third transistor. The protection circuit may include a third controlled path through a fourth transistor, if low voltage circuitry is tied to the signal node. The fourth transistor includes a gate that is tied high by connection of the gate to ground via a transistor and inverter.

18 Claims, 1 Drawing Sheet

5,473,500

ELECTROSTATIC DISCHARGE CIRCUIT FOR HIGH SPEED, HIGH VOLTAGE CIRCUITRY

TECHNICAL FIELD

The present invention relates generally to circuits for protecting integrated circuitry from damage caused by electrostatic discharge and more particularly to electrostatic discharge protection of high speed, high voltage circuitry.

BACKGROUND ART

In the fabrication of integrated circuits using metal oxide semiconductor (MOS) techniques, gate oxide layers are becoming increasingly thinner in order to achieve further increases in transistor performance. For a given set of terminal voltages, the drain current of an MOS transistor is inversely proportional to the thickness of the gate oxide layer. A thin gate transistor may have a 15 nm gate oxide.

A concern in the operation and handling of circuits having thin gate transistors is the susceptibility of the circuits to damage caused by electrostatic discharge (ESD). The dielectric breakdown strength of silicon dioxide is approximately $8 \times 10^6$ V/cm, so that a 15 nm gate oxide will be unable to withstand a voltage exceeding 12 V. However, an ESD pulse may have a peak of several thousand volts. A primary source of ESD pulses is human handling of an integrated circuit package having input/output pins or pads.

Circuits for providing ESD protection are known. FIG. 1 is a prior art ESD protection circuit. A signal is applied at an input pad or pin 10. A first transistor 12 and a second transistor 14 are employed to discharge high voltage pulses. A negative-going pulse generated by an ESD strike is discharged via the first transistor 12. The gate 16 of the first transistor is tied to $V_{cc}$. A negative-going ESD pulse will turn on the second transistor 14, which has a source 18 that is tied to ground. The first and second transistors will discharge most of the ESD pulse by establishing a path to either $V_{cc}$ or ground, with much of the remainder of the charge being discharged via a third transistor 20 by means of drain voltage punch through. Bipolar turn-on of parasitic bipolar transistors of the first, second and third transistors accounts for additional pulse discharge.

The circuit of FIG. 1 has a number of limitations. The first and second transistors 12 and 14 are typically metal field effect transistors having a high turn-on voltage, e.g., 15–20 V, and having long channel lengths. Consequently, the two transistors carry some inherent inefficiency in discharging an ESD pulse. Charge from an ESD pulse which is not sufficiently discharged may pass to internal circuitry 22 which is to be protected. The charge may damage gates of transistors of the circuitry 22.

Another limitation of the circuit is that while the third transistor 20 is a thin gate transistor, its connection within the circuit renders the third transistor susceptible to gate-aided junction breakdown. If the voltage across the transistor exceeds the breakdown voltage of the device, damage to the transistor may result in permanent shorting of the input signal to ground.

The ESD protection circuit also includes a resistor 24 between the input pad 10 and the internal circuitry 22 to be protected. The purpose of the resistor is to better ensure that the first and second transistors 12 and 14 are the lower impedance paths for discharging most of an ESD charge before reaching the thin gate third transistor 20. That is, the resistor 24 functions to protect the third transistors from high voltages which potentially cause permanent damage. However, the resistor introduces an RC delay in the input path to the internal circuitry 22. This delay imposes a limitation to high speed circuitry.

Yet another limitation of the ESD protection circuit of FIG. 1 involves high voltage applications. If the internal circuitry 22 includes non-volatile high speed devices such as one or more PLD, EPROM, FPGA or flash device, an ESD protection circuit must be capable of withstanding high voltages under d.c. operating conditions. For example, a programming signal may require a 20 V input at the pad 10. While the metal field effect transistors 12 and 14 are typically not susceptible to damage under these high voltage conditions, the thin gate third transistor may breakdown and cause a permanent short to ground.

An object of the present invention is to provide a circuit which achieves protection for electrostatic discharge without introducing limitations to either high voltage or high speed circuit operations.

SUMMARY OF THE INVENTION

The above object has been met by utilizing active MOS transistors to provide a first controlled path for negative voltage ESD pulses and a second controlled path for voltage-dividing positive voltage ESD pulses, thereby permitting use of high speed devices. The gates of the transistors are tied to either ground potential or a fixed voltage supply potential ($V_{cc}$) by means of a resistor and inverter, so as to isolate the gates and increase both gate voltage and transistor conductance.

The first controlled path is from a signal node, such as an input pad, to $V_{cc}$ via source and drain electrodes of a first thin gate MOS transistor. The gate of the transistor is linked to $V_{cc}$ by a resistor and an inverter, thereby establishing a soft ground at the gate. A parasitic capacitor from the gate to the input pad boosts the gate voltage to turn the transistor on more strongly. The transistor will turn on at its threshold voltage, and because of the soft ground at the gate, the gate will be bootstrapped up for effective discharge of the negative-going electrostatic pulse.

The second controlled path includes second and third thin gate MOS transistors. The two transistors are connected in series from the signal node to ground, with the second transistor being joined to the signal node and the third transistor being joined to ground. The gate of the third transistor is electrically coupled to $V_{cc}$ in the same manner as the first transistor, i.e. via a resistor and an inverter. Consequently, the gate is at soft ground.

The gate of the second transistor is connected to ground via a resistor and an inverter. Because the gate of the third is at $V_{cc}$, the highest voltage that will be applied to the drain of the third transistor is the difference between $V_{cc}$ and the threshold voltage of the second transistor. Conventionally, $V_{cc}$ is 5 volts. If the threshold voltage is 1 volt, the third transistor will encounter a maximum voltage of 4 volts.

The combination of the second and third transistors to form a controlled path for discharging positive electrostatic pulses permits the use of thin gate transistors and allows operation of protected circuitry at positive voltages that exceed the breakdown voltages of the transistors. For example, a programming signal of 20 V may be applied to the signal node without damaging the thin gate transistors of the ESD protection circuit.

In a preferred embodiment, a fourth transistor provides a third controlled path to internal circuitry which is not to be operated at a high voltage. The source and drain of the fourth transistor are connected to join the signal node to the low voltage internal circuitry to be protected. The gate is linked to ground via a resistor and an inverter, thereby establishing $V_{cc}$ at the gate. In this manner, the low voltage internal circuitry will be limited to voltages which will not exceed $V_{cc}$.

In a preferred embodiment, each of the first and second thin gate transistors and the parasitic capacitors associated with the two transistors are joined to the signal node by a low value resistor. The resistors provide a small resistance that inhibits bipolar snapback of parasitic bipolar transistors of the thin gate MOS transistors.

An advantage of the present invention is that the circuit allows both ESD protection and passage of high operating voltages. Another advantage is that no resistance is added in the path from the signal node to the circuitry to be protected. Consequently, no RC delay which would inhibit high speed operation is introduced.

BEST MODE FOR CARRYING OUT THE INVENTION

Figure 1:
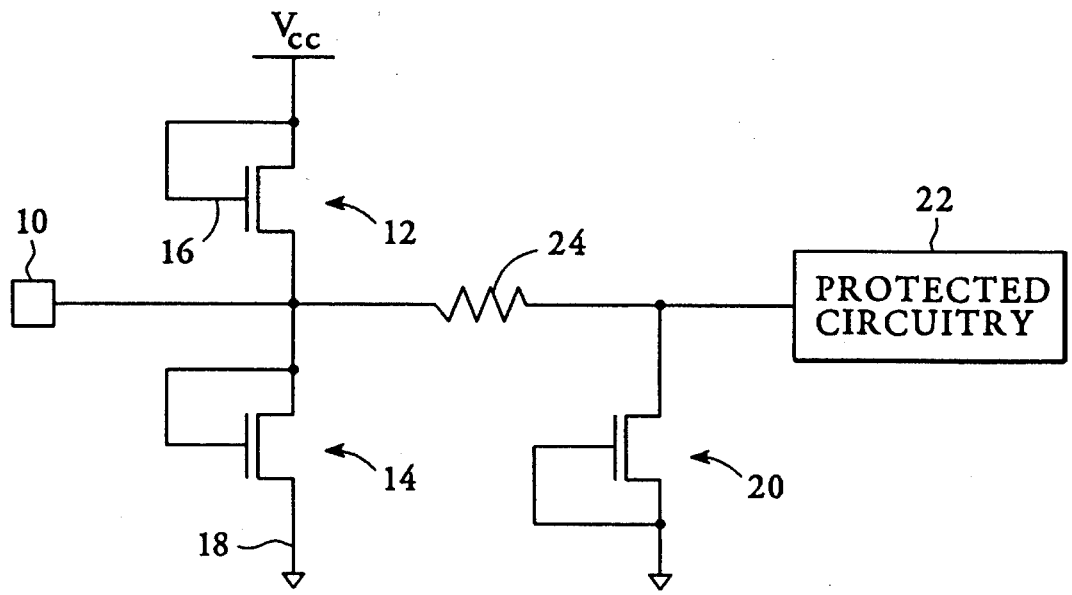
FIG. 1 is a schematic diagram of a prior art ESD protection circuit.
Figure 2:
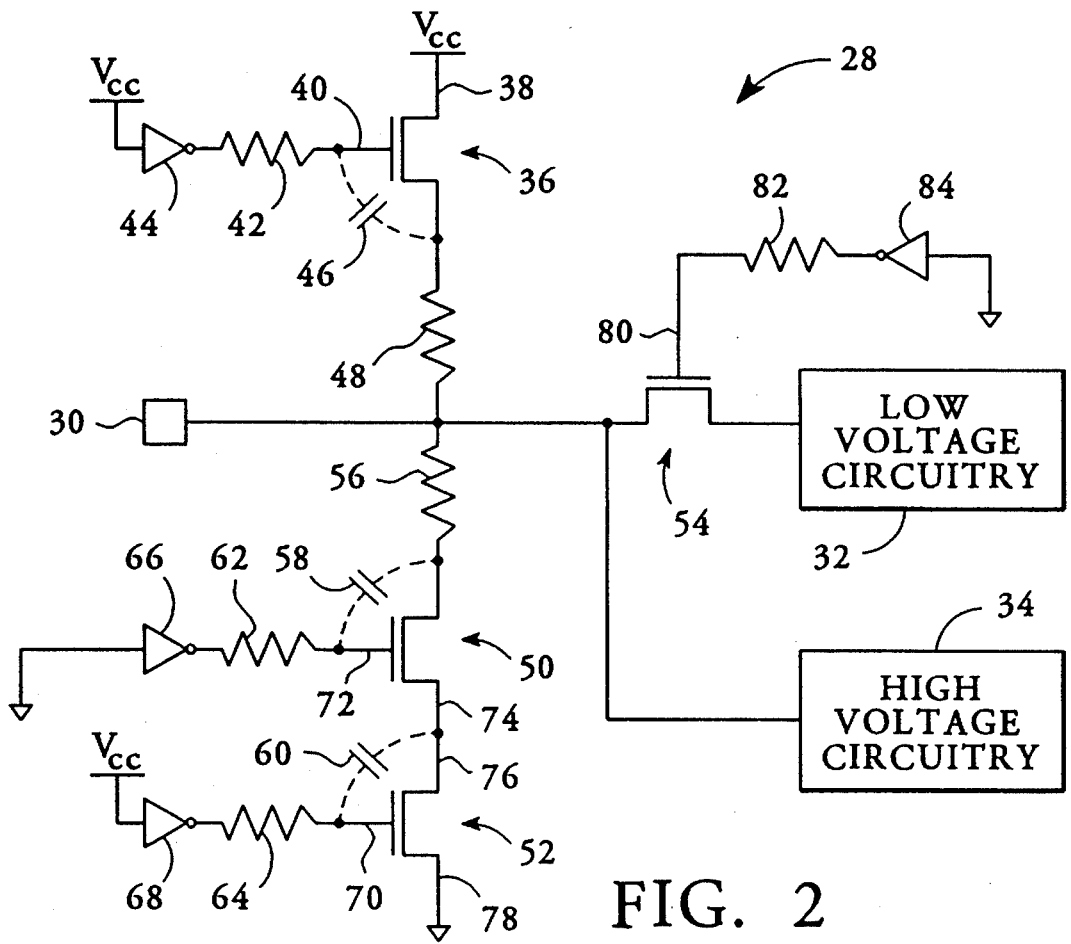
FIG. 2 is a schematic diagram of a high speed, high voltage protection circuit in accordance with the present invention.

With reference to FIG. 2, a protection circuit 28 is shown as having a signal node 30, such as an input pad, and protected circuitry that is split into circuitry 32 operable at low voltages and circuitry 34 that is operable at both high and low voltages. While FIG. 2 illustrates the preferred embodiment of the invention, the inclusion of both high and low voltage circuitry is not critical to the invention.

Negative-going electrostatic pulses that are unintentionally applied at the signal node 30 are discharged via a first controlled path that includes a first transistor 36. The controlled path extends to $V_{cc}$ at node 38. Conventionally, $V_{cc}$ is 5 V, but the fixed power supply voltage for operating MOS circuits may vary with specific applications. For example, $V_{cc}$ is somewhat lower for battery operated laptop computers.

The gate 40 of the first transistor 36 is linked to $V_{cc}$ by means of a resistor 42 and an inverter 44. This arrangement establishes a "soft ground" at the gate 40. A parasitic capacitor 46 capacitively couples the gate 40 to a resistor 48 placed along the first controlled path from the signal node 30.

The first transistor 36, as well second, third and fourth transistors 50, 52 and 54 are thin gate, short channel transistors. The shorter the transistor channel, the more efficient the circuit is at discharging an ESD pulse. In the preferred embodiment, the channel lengths are in a range of 1.2 μm to 1.4 μm. The thickness of the gate oxide is preferably less than 300 Å, and ideally is in the range of 100 Å to 200 Å. However, none of these dimensions is critical to the invention.

In operation, a negative ESD pulse will exceed the threshold voltage of the first transistor 36, thereby turning the first transistor on. The parasitic capacitor 46 aids in boosting the gate voltage for efficient discharge of the ESD pulse. The capacitor and the resistor 42 define an RC time constant that delays the turn off of the first transistor. The capacitor discharges through the resistor 42 to the inverter 44 to achieve a timing that enhances efficiency. The resistor isolates the gate 40 from the inverter in order to increase gate voltage and transistor conductance. Since the transistor 36 is a thin gate device, the transistor turns on at a threshold voltage of approximately 1 V, and due to the soft ground, the gate is bootstrapped up, further enhancing efficiency. The threshold voltages of transistors may be varied according to design and fabrication techniques understood by persons skilled in the art.

The resistor 48 within the first controlled path from the signal node 30 to $V_{cc}$ is typically a resistor fabricated by diffusion techniques. While not shown in FIG. 2, the first transistor will have a parasitic bipolar transistor. The resistor 48 provides a small resistance that prevents bipolar snapback that might otherwise be caused by excessive currents.

The protection circuit 28 includes a second controlled path defined by a resistor 56 and a series connection of the second and third thin gate MOS transistors 50 and 52. The resistor 56 functions to prevent bipolar snapback in the same manner as the resistor 48 described above. Drain-to-gate parasitic capacitors 58 and 60 act in combination with resistors 62 and 64 to establish an RC delay for ensuring that the second controlled path conducts for a sufficient time to efficiently discharge a positive ESD pulse. The discharge of a parasitic capacitor will be through the associated resistor to an inverter 66 and 68. The inverter 68 of the third transistor 52 is connected to $V_{cc}$, so that the gate 70 of the transistor has the same "soft ground" as the first transistor 36. The inverter 66 of the second transistor 50 is connected to ground.

The series connection of the second and third transistors 50 and 52 permits an input of a high voltage, e.g. 20 V, at the signal node 30 for programming or other operation of the circuitry 34 without damaging the thin gate third MOS transistor 52. The N-channel second transistor 50 has a gate 72 that is tied high at $V_{cc}$, while the gate 70 of the third N-channel transistor 52 is tied low at soft ground. When a high voltage programming signal or a positive ESD pulse is introduced at the signal node 30, the second transistor will prevent the full voltage from reaching the third transistor 52. When the junction of the source 74 of the second transistor and the drain 76 of the third transistor reaches a potential equal to the potential difference between the gate 72 and the threshold voltage of the second transistor, the second transistor will be turned off and no further voltage increase will reach the drain 76 of the third transistor. In the embodiment described above, the gate 72 is at the $V_{cc}$ voltage of 5 V and the threshold voltage is approximately 1 V, so that the voltage across drain 76 and source 78 of the third transistor will be limited to 4 V. However, these voltages are not critical to the invention.

In operation, the second controlled path will discharge a positive ESD pulse in basically the same manner as the first controlled path discharges a negative ESD pulse. The important difference is that high voltage operation of the circuitry 34 is permitted without damage to the second controlled path by the use of the voltage-limiting transistor 50.

The protection circuit 28 also includes a third controlled path. The path includes the fourth MOS transistor 54, which has drain and source electrodes connected to the signal node 30 and the low voltage circuitry 32. A gate 80 is tied high by the use of a resistor 82 and an inverter 84 connected to ground in the same manner as the second transistor 50. Thus, the maximum voltage which can reach the circuitry 32 is the potential difference between the gate 80, e.g. 5 volts, and the threshold voltage of the fourth transistor, e.g. 1 volt. At this maximum voltage, the gates of devices in the low voltage circuitry are not subjected to a potentially damaging voltage applied at the signal node 30.

The protection circuit 28 discharges positive and negative ESD pulses, while permitting passage of voltages for the designed operation of the high voltage circuitry 34. Moreover, because the circuitry 32 and the circuitry 34 are tied to the signal node 30 without the need of a resistor, the protection circuit does not introduce an RC delay which would impose a limitation on high speed operation.

We claim:

1. An electrostatic discharge protection circuit for circuitry operable at a first positive voltage (Vcc) and at a second voltage substantially above a said first positive voltage comprising:

an input pad forming a signal node;

first means for discharging a negative electrostatic pulse applied to said signal node, said first means including a first MOS transistor having source and drain electrodes connected to provide a controlled path between said signal node and Vcc, said first MOS transistor having a gate connected to be substantially at ground potential and having a first capacitive coupling of said gate of said first MOS transistor to said input pad; and second means for discharging a positive electrostatic pulse applied at said signal node, said second means including second and third MOS transistors having source and drain electrodes in series connection to provide a controlled path from ground potential to said signal node, said controlled path from ground potential including connecting said drain electrode of said second MOS transistor to said signal node and including connecting said source electrode of said third MOS transistor to ground potential, said second MOS transistor having a gate controlled to be substantially at Vcc and a second capacitive coupling of said gate of said second MOS transistor to said input pad, said third MOS transistor having a gate connected to be substantially at ground potential and a third capacitive coupling of said gate of said third MOS transistor to said drain of said third MOS transistor, wherein said second MOS transistor limits the potential difference across said third MOS transistor when a positive voltage substantially above Vcc is applied to said signal node.

2. The circuit of claim 1 wherein said gates of said first and third MOS transistors are each joined to $V_{cc}$ via an inverter, thereby tying said gates substantially at ground potential.

3. The circuit of claim 2 wherein said gate of said second MOS transistor is coupled to ground potential via an inverter, thereby tying said gate substantially at Vcc.

4. The circuit of claim 3 wherein a separate resistor is coupled between the gate of said first, second, and third MOS transistors and their corresponding inverter.

5. The circuit of claim 1 wherein said first, second and third MOS transistors are thin gate, short channel transistors.

6. The circuit of claim 5 wherein said gates have a thickness of less than 300 Å and said MOS transistors each have channels not exceeding 1.4 μm.

7. The circuit of claim 1 wherein said signal node is connected to internal circuitry programmable by voltages substantially above Vcc.

8. The circuit of claim 7 wherein said input pad is further connected to second internal circuitry susceptible to damage at voltages substantially above Vcc, said circuit further comprising a fourth MOS transistor having source and drain electrodes connected to establish a path from said input pad to said second internal circuitry, said fourth MOS transistor having a gate coupled via a resistor to an inverter, said inverter having an input tied to ground potential, thereby tying said gate substantially at Vcc.

9. The circuit of claim 1 further comprising a first resistance means connected between said signal node and the source of said first transistor and a second resistance means connected between said signal node and the drain of said second transistor.

10. An electrostatic discharge circuit for protecting high voltage circuitry comprising:

an input pad;

a first transistor having a source connected to said input pad and having a drain tied to a fixed voltage source, said first transistor having a gate connected to said fixed voltage source via a first inverter and having a first parasitic capacitor capacitively coupling said gate of said first transistor and said input pad;

an active second transistor having a drain connected to said input pad and having a gate connected to ground potential via a second inverter, said second transistor further having a second parasitic capacitor capacitively coupling said gate of said second transistor and said input pad; and a third transistor having a source tied to ground potential and having a drain connected to a source of said second transistor to establish a controlled path from said input pad to ground potential via said second and third transistors, said third transistor having a gate connected to said fixed voltage source via a third inverter and having a third parasitic capacitor capacitively coupling said gate of said third transistor and said drain of said third transistor.

11. The circuit of claim 10 further comprising a separate resistor connected between each of said first, second and third transistors and the associated one of said first, second and third inverters.

12. The circuit of claim 10 further comprising a first resistor connected between said input pad and said first transistor and a second resistor connected between said input pad and said second transistor.

13. The circuit of claim 10 further comprising a fourth transistor having a source and drain connected to establish a controlled path from said input pad to an internal circuit, said fourth transistor having a gate coupled via a resistance to the output of a fourth inverter, an input of said fourth inverter being tied to ground potential, thereby tying said gate substantially at Vcc.

14. The circuit of claim 10 wherein each of said first, second, third and fourth transistors is a thin gate transistor.

15. A circuit comprising:

a signal node from an input pad;

negative electrostatic pulse discharge means, including a first transistor having a source and a drain coupled between said signal node and a voltage source of a potential (Vcc) to establish a controlled path therebetween, said first transistor having a gate coupled via a first resistance means to a first inverter means coupled to said voltage means, thereby tying the gate of said first transistor substantially to ground potential, and having a first parasitic capacitor capacitively coupling said gate of said first transistor and said input pad;

positive electrostatic pulse discharge means, including serially connected second and third transistors coupled between said signal node and ground potential to establish a controlled path therebetween, said second transistor having a gate coupled via a second resistance means to a second inverter means coupled to ground potential and having a second parasitic capacitor capacitively coupling said gate of said second transistor and said input pad, said third transistor having a gate coupled via a third resistance means to a third inverter means coupled to said voltage source and having a third parasitic capacitor capacitively coupling said gate of said third transistor and a drain electrode of said third transistor; and first circuitry operable at a voltage potential significantly greater than Vcc, said first circuitry being connected to said signal node to respond to voltages applied to said signal node.

16. The circuit of claim 15 further comprising a fourth transistor having a source and a drain connected to establish a controlled path between said signal node and second circuitry responsive to voltages applied to said signal node, said fourth transistor having a gate coupled via a fourth resistance means to a fourth inverter means coupled to ground potential.

17. The circuit of claim 15 wherein said voltage source is a source of five volts and wherein each of said first, second and third transistors has a threshold voltage of approximately one volt.

18. The circuit of claim 15 further comprising a fifth resistance means connected between said signal node and the source of said first transistor and a sixth resistance means connected between said signal node and the drain of said second transistor.

* * * * *